(12) United States Patent
Mutsaers et al.

(10) Patent No.: US 6,429,450 B1
(45) Date of Patent: *Aug. 6, 2002

(54) METHOD OF MANUFACTURING A FIELD-EFFECT TRANSISTOR SUBSTANTIALLY CONSISTING OF ORGANIC MATERIALS

(75) Inventors: Cornelius M. J. Mutsaers; Dagobert M. De Leeuw; Christopher J. Drury, all of Eindhoven (NL)

(73) Assignee: Koninklijke Philips Electronics N.V., Eindhoven (NL)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/135,416

(22) Filed: Aug. 17, 1998

(30) Foreign Application Priority Data

Aug. 22, 1997 (EP) .............................. 97202587

(51) Int. Cl.⁷ ............................................... H01L 35/24
(52) U.S. Cl. .......................... 257/40; 257/410; 257/613; 438/99
(58) Field of Search .......................... 257/40, 410, 613, 257/741; 438/99

(56) References Cited

U.S. PATENT DOCUMENTS

| 5,347,144 A | 9/1994 | Garnier et al. ................. 257/40 |
| 5,447,824 A | 9/1995 | Mutsaers et al. ............ 430/315 |
| 5,620,800 A | 4/1997 | De Leeuw et al. .......... 428/469 |

FOREIGN PATENT DOCUMENTS

JP          1-259563       10/1989     ........... H01L/29/78

OTHER PUBLICATIONS

"All–Polymer Field–Effect Transistor Realized by Printing Techniques", by Garnier et al, Science, vol. 265, Sep. 16, 1994.

"Logic Gates Made from Polymer Transistors and Their Use in Ring Oscillators", by Brown et al, Science, vol. 270, Nov. 10, 1995, pp. 972–974.

*Primary Examiner*—Sara Crane
(74) *Attorney, Agent, or Firm*—Ernestine C. Bartlett

(57) ABSTRACT

A practical method of manufacturing an organic field-effect transistor is disclosed. By applying the insulating layer, preferably having a thickness of 0.3 μm or less to a substantially planar electrode layer, an organic field-effect transistor can be made having a channel length down to 2 μm, satisfying the condition for voltage amplification at voltages well below 10 V, and having an on/off ratio of about 25.

25 Claims, 2 Drawing Sheets

METHOD OF MANUFACTURING A FIELD-EFFECT TRANSISTOR SUBSTANTIALLY CONSISTING OF ORGANIC MATERIALS

BACKGROUND OF THE INVENTION

The invention relates to a method of manufacturing a field-effect transistor substantially consisting of organic materials.

The invention also relates to a field-effect transistor substantially consisting of organic materials.

The invention further relates to an integrated circuit (IC) comprising such a field-effect transistor (FET).

An integrated circuit comprising field-effect transistors substantially consisting of organic materials, in short organic field-effect transistors, is well suited for those electronic applications where using an integrated circuit manufactured using silicon technology would be prohibitively expensive. Examples include electronic bar codes.

As is well known by those skilled in the art, if an IC is to perform its task, it is imperative that the integrated logic gates, such as invertors, NOR and NAND gates, attain voltage amplification at the operating voltage. In order to attain voltage amplification, each individual field-effect transistor must be operated in a saturated regime, which is the regime where the channel transconductance exceeds the channel conductance.

A method of the type mentioned in the opening paragraph, which provides an organic FET satisfying said condition for voltage amplification is known from an article by Garnier et al. published in Science, vol. 265 (1994), pp. 1684–1686. In said known method a 1.5 $\mu$m thick polyester film is framed and is printed on both sides with a graphite-filled polymer ink, so as to form a 10 $\mu$m thick gate electrode on the one side and a source and drain electrode on the other side. Between the source and drain a 40 nm semiconducting sexithiophene layer is then deposited using flash evaporation.

A disadvantage of the known method is that the organic FETs provided by the method satisfy the condition for voltage amplification only at rather high (negative) source drain voltages. Typically, the difference is 30 V or higher. For many electronic applications, such as battery operated applications, such a voltage is too high. Also, the method is not very practical, not least because it involves framing and printing on a layer of only 1.5 $\mu$m. Such a thin film is very fragile and easily ruptures while being handled, leading to a defective device.

SUMMARY OF THE INVENTION

An object of the invention is, inter alia, to provide a novel method of manufacturing a field-effect transistor substantially consisting of organic materials. The novel method should enable, in a practical manner, the manufacture of an organic FET satisfying the condition of voltage amplification at a source drain voltage difference significantly less than 30 V, in particular less than 10 V.

The object of the invention is achieved by a method of manufacturing a field-effect transistor substantially consisting of organic materials on a substrate surface, said method comprising the steps of:

providing an electrically insulating substrate surface, applying an organic first electrode layer accommodating a source and drain electrode and demonstrating a patchwork pattern of electrically insulating and conducting areas, applying an organic semiconducting layer preferably of a thickness so selected that the condition for voltage amplification is satisfied at source drain voltages less than 10 V, and especially, applying an organic electrically insulating layer having a thickness less than 0.3 $\mu$m, applying an organic second electrode layer accommodating a gate electrode.

Using the method in accordance with the invention, it is possible to manufacture FETs satisfying the condition of voltage amplification at source drain voltages below 10 V, for example, about 2.5 V.

The invention is based on the insight that a very thin electrically insulating layer, that is a layer having a thickness of 0.3 $\mu$m or less, is required if an organic FET is to satisfy the condition of voltage amplification at a source drain voltage difference of less than 10 V. It is further based on the insight that such a thin insulating layer can only be obtained in a practical manner if (in contrast to the known method in which the insulating layer is used as a substrate for depositing the electrodes) the thin insulating layer is supported by a substrate throughout the manufacture of the FET. Most conveniently, the insulating layer is applied to a surface which is substantially planar. Manufacturing the first electrode layer in the form of a patchwork pattern of electrically insulating and conducting areas provides a substantially planar surface (the difference in thickness between the insulating and conducting areas being 0.05 $\mu$m or less).

The method in accordance with the invention is simple and cost effective. It involves few steps. The first and second electrode layer, as well as the insulating and semiconducting layer, can be, and preferably are, all applied from solution using coating techniques known per se, such as spin-coating, dip-coating, spray-coating, curtain-coating, silkscreen-printing, offset-printing, Langmuir Blodgett and the doctor blade technique.

The field-effect transistor obtained by employing the method in accordance with the invention operates in the usual manner. The semiconducting layer comprises an area, the channel, which interconnects the source and the drain electrode. The gate electrode is electrically insulated from the channel by means of the insulating layer and overlaps the channel. If a voltage is applied between the source and drain electrode, a current, i.e. the source drain current, will flow through the channel. By applying a gate voltage, an electric field is established across the semiconducting layer which will, depending on the polarity of both the gate voltage and the charge carriers, modify the free charge carrier distribution in the channel, thereby changing the resistivity of the channel and the source drain current. If the source drain voltage is increased while the gate voltage is kept constant, the source drain current will begin to saturate and at some point the condition of voltage amplification, i.e. the channel transconductance exceeding the channel conductance, is satisfied.

The first electrode layer comprises electrically insulating and conducting areas, which may be of any convenient shape. The source and drain electrode are accommodated by separate conducting areas. In order to increase the channel width, thus allowing more current between source and drain, the source and drain electrode are preferably interdigitated.

In order to minimize the leakage current and the voltage drop between separate conducting areas, in particular between the source and drain electrodes, the sheet resistance of the insulating areas needs to be as high as possible. A suitable sheet resistance exceeds $10^{10}$ $\Omega$/square, or better $10^{12}$ $\Omega$/square or better still $10^{13}$ $\Omega$/square.

The specific conductivity of the conducting areas of the electrode layer is chosen such that the source drain current is substantially determined by the resistivity of the channel. A suitable specific conductivity of the conducting areas is 0.1 S/cm or better 1 S/cm or better still more than 10 S/cm.

Applying the patchwork patterned first electrode layer is for example done by applying a semiconducting polymer in an insulating state from solution, applying and patterning a photoresist layer photolithographically and introducing conducting areas by selective indiffusion of a dopant which converts locally the polymer from its insulating to a conducting state.

Preferably, the patchwork patterned first electrode layer is applied without using the elaborate technique of photolithography. This is achieved by an embodiment of the method in accordance with the invention which is characterized in that the organic first electrode is applied by performing the method steps of applying an organic radiation-sensitive layer, irradiating said radiation-sensitive layer according to a desired pattern, thereby forming an organic first electrode layer accommodating a source and drain electrode and demonstrating a patchwork pattern of irradiated electrically insulating and non-irradiated conducting areas.

Examples of radiation-sensitive layers which have been found effective in the context of the present invention, are disclosed in U.S. Pat. Nos. 5,427,841, 5,620,800 and 5,447,824, assigned to U.S. Philips Corporation.

Within the context of the present invention, use is preferably made of a radiation-sensitive layer comprising an electrically conducting polyaniline and a photochemical radical initiator. Surprisingly, it has been found that such a layer may be rendered radiation insensitive by a simple heat treatment at for example 110° C. This property is very advantageous if an IC is to be manufactured, especially if multi level interconnects are required, for it allows the second (and any further) electrode layer to be patchwork patterned employing the same radiation-sensitive composition and method steps without the pattern of the first electrode layer being affected by the radiation employed in providing said second electrode layer.

Onto the first electrode layer an organic semiconducting layer is applied. Suitable semiconducting layers comprise organic compounds having an extensive conjugated system of double and/or triple bonds such as conjugated polymers (in the context of the invention, the term polymer includes oligomer) and fused (heterosubstituted) polycyclic hydrocarbons. Examples include polypyrroles, polyphenylenes, polythiophenes, polyphenylenevinylenes, poly(di)acetylenes, polyfuranes and polyanilines. As known by those skilled in the art, such compounds may be rendered semiconducting by doping with an oxidizing agent, reducing agent and/or (Bronsted) acid. It may happen that the method of preparing the semiconducting compound is such that the compound is obtained in the semiconducting state without explicitly adding a dopant, in which case the compound is said to be unintentionally doped.

In case a subsequent layer is to be provided from solution using a solvent, the semiconducting layer may swell or even dissolve into the subsequent layer before the solvent is removed, thus ruining the definition of the interface. In order to prevent this from happening, use is preferably made of an insoluble semiconducting compound obtainable from a soluble precursor compound. Examples of such compounds, viz. a polythienylenevinylene and a pentacene, are described in a publication by Brown et al. in Science, vol. 270, (1995), pp. 972–974.

Onto the semiconducting layer an organic electrically insulating layer is applied which electrically insulates the gate electrode from the semiconducting layer.

The electrically insulating layer preferably has a high capacitance so as to induce a large current between source and drain using a low gate voltage which is accomplished by using a material with a large dielectric constant and/or a small layer thickness.

In order to reduce the risk of short circuits and/or the leakage current between gate and source/drain, the thickness of the insulating layer is preferably more than 0.05 $\mu$m.

Examples of suitable organic electrically insulating materials are disclosed in United States patent specification U.S. Pat. No. 5,347,144.

If a subsequent layer is applied from solution onto the electrically insulating layer, there is a risk that it swells, dissolves or mixes with the subsequent layer before the solvent has evaporated from the solution. In order to reduce this risk it has been found favourable to employ an insulating material which can be rendered insoluble by cross-linking. A preferred embodiment of the method in accordance with the invention is therefore characterized in that the organic electrically insulating layer comprises a cross-linked polymer.

A cross-linkable polymer which has been found very effective is a polyvinylphenol. It can be cross-linked by adding a cross-linking agent such as hexamethoxymethylenemelamine and heating.

The organic FET is completed by applying a second electrode layer accommodating a gate electrode. The insulating layer already being in place, the (variation in) layer thickness and the deposition process is less critical. For example, the second electrode layer can be suitably applied using the method disclosed in the article by Garnier et al. cited hereinabove, that is, printing of a graphite filled polymer ink. However, a method of manufacturing the organic FET, which is more economical and allows a higher resolution, results if the second electrode is applied in the same manner as the first electrode layer.

The method involves providing an electrically insulating substrate surface. The surface should be planar and smooth. Suitable substrates are ceramics, glass, silica or, preferably, (laminated) polymer foils such as polystyrene, polyamide, polyamide and polyester foils. If a first electrode layer comprising conductive polyaniline and a photochemical radical initiator is applied, the substrate surface preferably comprises (crosslinked) polyvinylphenol or polyvinylalcohol.

A preferred embodiment of the method in accordance with the invention is the method which comprises the additional steps of providing an electrically insulating substrate surface, applying, from solution, a first organic radiation-sensitive layer comprising a conductive polyaniline and a photochemical radical initiator, irradiating said first radiation-sensitive layer according to a desired pattern, thereby forming an organic first electrode layer accommodating a source and drain electrode and demonstrating a patchwork pattern of irradiated electrically insulating and non-irradiated conducting areas, heating the first electrode layer at a temperature sufficient to render said first electrode layer radiation-insensitive, applying, from solution, a second organic semiconducting layer comprising a polythienylenevunylene, applying, from solution, a cross-linkable polymer composition, cross-linking the cross-linkable polymer composition, thereby forming an organic electrically insulating layer comprising a cross-linked polymer composition, applying, from solution, a second organic radiation-sensitive layer comprising a conductive polyaniline and a photochemical radical initiator, irradiating said second radiation-sensitive layer according to a desired pattern, thereby forming an organic second electrode layer accomodating a gate electrode and demonstrating a patchwork pattern of irradiated electrically insulating and non-irradiated conducting areas.

This method has been found particularly suitable in that each time a subsequent layer is applied from solution, swelling or dissolution of the preceding layer does not occur. The method moreover allows FETs having a channel length as small as 1 to 2 $\mu$m to be produced in a reliable and practical manner.

The inventors have observed that if a field-effect transistor manufactured using the method in accordance the invention is operated for a long time (for minutes to hours) at high source drain voltage differences, there is a risk that the performance of the FET deteriorates to the extent that it does no longer satisfy the condition for voltage amplification at voltages below 10 V. In order to reduce this risk, a preferred embodiment of the method in accordance with the invention is characterized in that before the semiconducting layer is applied, the electrically insulating areas of the first electrode layer are removed, thereby forming a first electrode layer demonstrating a relief pattern of conducting areas.

In case the first electrode layer comprises polyaniline, removal can be achieved, for example, by dissolving selectively the electrically insulating areas in N-methylpyrrolidone.

Surprisingly, the presence of a relief pattern does not lead to a dramatic increase in leakage current or short circuits between the source (drain) and gate electrode. At least this is found to be the case if the thickness of the first electrode layer is chosen to be smaller than the thickness of the insulating layer. Apparently, a relief pattern satisfying this criterion provides a surface which is more or less planar from the viewpoint of the capability of said surface to serve as a substrate surface onto which a very thin insulating layer can be applied in a practical manner.

The FET obtained by employing (preferred embodiments of) the method in accordance with the invention is a top gate field-effect transistor. However, it will be obvious to those skilled in the art that if a bottom gate field-effect transistor is desired, the method in accordance with the invention is simply modified in that the gate electrode is accommodated by the first and the source and drain electrodes are accommodated by the second electrode layer, and the semiconducting and electrically insulating layer are applied in reverse order. Yet another bottom gate FET is obtained if the method of manufacturing the bottom gate FET is modified in that the second electrode and semiconducting layer are applied in reverse order.

The invention also relates to a field-effect transistor substantially consisting of organic materials, that is a field-effect transistor comprising a stack of:

an organic first electrode layer accommodating a source and drain electrode and demonstrating a relief pattern of electrically conducting areas, an organic semiconducting layer, an organic electrically insulating layer, and an organic second electrode layer accommodating a gate electrode.

The remarkable observation, described hereinabove, that the presence of a relief patterned first electrode layer does not lead to large leakage currents between the source (drain) and gate electrode if the thickness of this layer is less than that of the insulating layer, remains valid regardless of the method of preparing the relief pattern. In accordance with the invention, the field-effect transistor is therefore characterized in that the thickness of the electrically insulating layer is greater than the thickness of the first and/or second electrode layer and less than 0.3 $\mu$m. It is clear that applying a 0.3 $\mu$m layer on a 0.3 $\mu$m topography results in an insulating layer which is neither planar nor planarized. Surprisingly, the use of planarised insulating layers appears to be superfluous. Short circuits are substantially absent if the surface defined by the first and/or second electrode layer has a topography smaller than the layer thickness of the insulating layer to be applied to that surface. In order to satisfy the condition for voltage amplification at a source drain voltage difference below 10 V, the insulating layer should have a thickness less than 0.3 $\mu$m. Since the insulating layer may be far from planar, the layer thickness is defined as the thickness that would have been obtained if, using the same method, it had been applied onto a planar surface.

In the Japanese Patent Application JP-A-1-259563, a field-effect transistor substantially consisting of organic materials is disclosed. Said document does not disclose a method of manufacturing such a device, let alone a practical method producing a field-effect transistor which satisfies the condition for voltage amplification below a source drain voltage of 10 V. The known field-effect transistor does not have a patchwork patterned electrode layer and the thickness of the planarized insulating layer is not specified.

The invention also relates to an integrated circuit comprising a field-effect transistor in accordance with the invention or a field-effect transistor obtainable by a method in accordance with the invention. Changing the pattern of the first and second electrode layer is all that needs to be done if not just one but a plurality of organic FETs is to be produced on a single substrate surface.

BRIEF DESCRIPTION OF THE DRAWINGS

These and other aspects of the invention will be apparent from and elucidated with reference to the embodiments described hereinafter.

In the drawings.

DESCRIPTION OF THE PREFERRED EMBODIMENTS

Exemplary Embodiment 1

Figure 1:
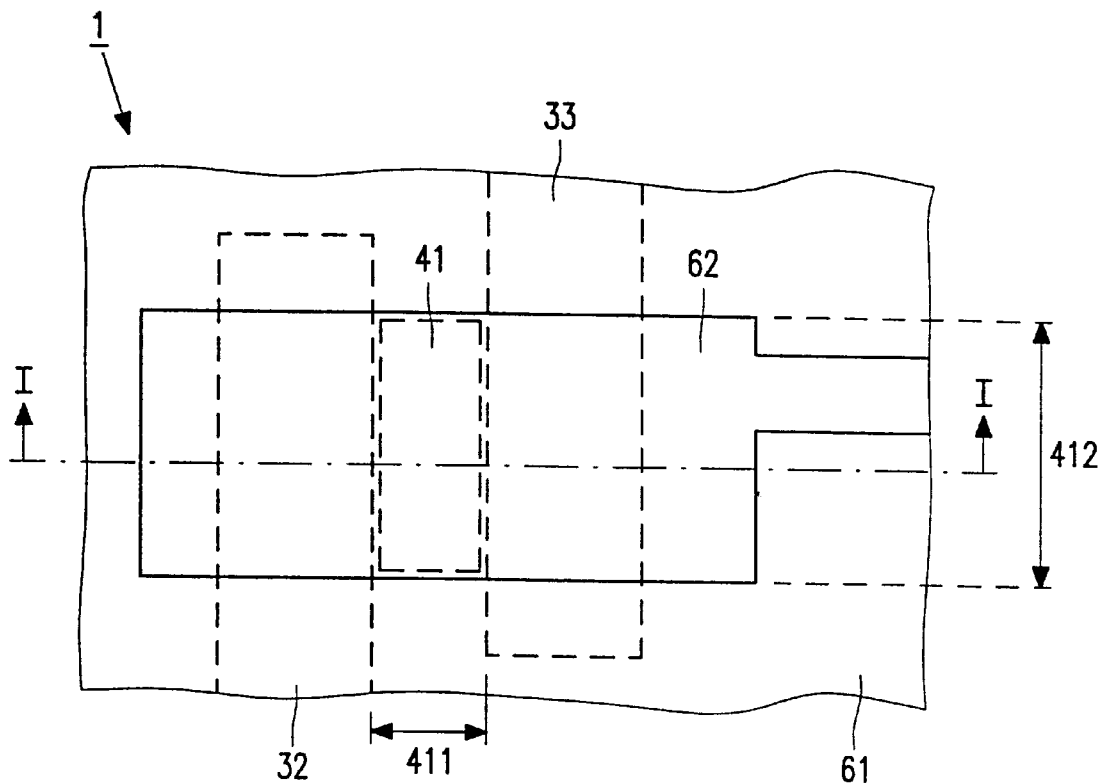
FIG. 1 schematically shows a transparent plan view of a field-effect transistor manufactured using the method in accordance with the invention, FIG. 2 schematically shows a cross-sectional view taken on the line I—I in FIG. 1.
Figure 2:
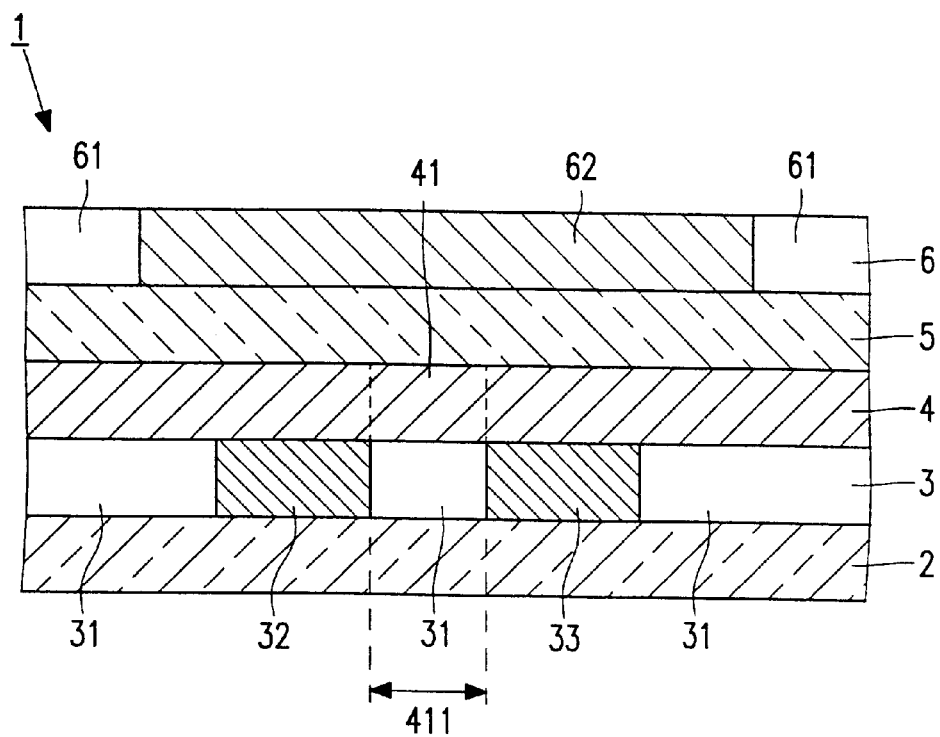

FIG. 1 schematically shows (not drawn to scale) a transparent plan view of a (part of a) field-effect transistor 1 manufactured using the method in accordance with the invention. FIG. 2 schematically shows (not drawn to scale) the field-effect transistor 1 in a cross-sectional view taken on the line I—I in FIG. 1. The field-effect transistor 1 comprises an electrically insulating substrate 2 on which is provided an organic first electrode layer 3 demonstrating a patchwork pattern of electrically insulating areas 31 and conducting areas 32 and 33. The conductive area 32 accommodates the source and the area 33 the drain electrode. The organic semiconducting layer 4 comprises a channel 41 (drawn so as to indicate the definition of channel length and width), of which the channel length L is indicated by reference number 411 and the channel width W by reference number 412. Covering the layer 4 and thus the channel 41 is the organic electrically insulating layer 5. It electrically insulates the gate electrode from the channel 41, said gate electrode being accommodated by the electrically conducting area 62 of the second electrode layer 6. In this particular example, but this is not essential, the layer 6 is a layer demonstrating a patchwork pattern of electrically insulating areas 61 and conducting areas 62.

As an example of the method in accordance with the invention, the field-effect transistor 1 may be manufactured as follows:

A) Preparation of a Conducting Polyaniline Solution

Emeraldine base polyaniline (Neste) (0.7 g, 7.7 mmol) and camphor sulphonic acid (Janssen) (0.8 g, 3.4 mmol) are ground together with a mortar and pestle in a nitrogen-filled glove box. The mixture is split in two and placed in two 30 ml polyethylene bottles each containing 30 g m-cresol and three agate balls (0.9 mm diameter). These are placed in a shaker (Retsch MM2) operating at full speed for 14 to 18 hours. The contents of the bottles are combined and then sonified for 5 minutes. The mixture is cooled to room temperature and then the sonification process is repeated. This mixture is then centrifuged at 12500 rpm for 2 hours. The conducting polyaniline solution thus obtained is pipetted off leaving any solids at the bottom of the centrifuge tubes.

B) Preparation of a Precursor Polythienylenevinylene Solution

A quantity of 10.0 g (0.028 mol) 2,5-thienylenedimethylene-bis(tetrahydrothiophenium chloride) (supplier Syncom BV, Groningen, The Netherlands) is dissolved in 100 ml of a 2/1 v/v mixture of methanol and demineralised water and cooled to $-22°$ C. in a nitrogen environment. Pentane (120 ml) is added and then sodium hydroxide (1.07 g, 0.0268 mol) dissolved in 100 ml of a 2/1 v/v mixture of methanol and demineralised water and cooled to $-22°$ C. is added instantaneously to the stirred monomer solution kept at $-22°$ C. That temperature is maintained for 2 hours and the mixture is then neutralised using 1.5 ml 2 N HCl. After having stored the mixture in a flask for 2 days, the liquid part is decanted off, and the remaining solid precursor poly(2,5-thienylenevinylene) is washed three times with methanol and dried in a vacuum. The precursor polymer is then dissolved in dichloromethane and concentrated to obtain a solution which after filtration (Millex LS 5 $\mu$m and Millex SR 0.5 $\mu$m) would give a 0.05 82 m film if spin-coated (3 s/500 rpm, 7 s/1000 rpm) onto a glass substrate.

C) Manufacture of the Field-effect Transistor 1

A 65 $\mu$m polyamide foil (supplier Sellotape) is secured on a 3 inch silicon wafer. A solution of 10.0 g (0.083 mol) polyvinylphenol (Polysciences Inc., cat #6527) and 1.625 g (4.17 mmol) hexamethoxymethylenemelamine (Cymel 300 from Cyanamid) in 36 g propylene glycol methyl ether acetate (Aldrich) is spin-coated (3 s/500 rpm, 27 s/2000 rpm) on the foil and then dried at 110 ° C. for 1 min on a hotplate. Cross-linking at 125° C. in a nitrogen atmosphere containing 5% v/v HCl for 5 min affords a 1.47 $\mu$m cross-linked polyvinylphenol film. The laminate thus obtained serves as the substrate 2 of which the polyvinylphenol coated side serves as the substrate surface on which subsequent layers are to be applied.

To 145 mg of the photochemical radical initiator 1-hydroxycyclohexyl phenyl ketone (tradename Irgacure 184, Ciba Geigy) is added 6 g of the conducting polyaniline solution prepared under A. After mixing well and sonifying twice for 1 min and cooling in between, the radiation-sensitive solution thus obtained is cooled and filtered (Millex FA, 1 $\mu$m). A radiation-sensitive layer is then formed by spin-coating (3 s/500 rpm, 7 s/2000 rpm) 1 ml of the radiation-sensitive solution on the polyvinylphenol coated surface of the substrate 2, and drying on a hotplate (2 min at 90° C.). The wafer is placed in a Karl Suss MJB3 aligner equipped with a 500 W Xe lamp and flushed with nitrogen for 3 min. A mask defining a plurality of interdigitated source and drain electrode patterns with channel lengths of 10, 5, 3, 2 $\mu$m at channel widths of 1 and 3 mm respectively (opaque areas of the mask corresponding to areas 32 and 33), is brought into contact with the radiation-sensitive layer. While continuously flushing with nitrogen, the radiation-sensitive layer is irradiated via the mask with deep UV light (60 s, 20 mW/cm$^2$ at 240 nm), thereby forming a first electrode layer 3 demonstrating a patchwork pattern of irradiated areas 31 and non-irradiated areas 32 and 33. The wafer is then heated on a hotplate (3 min at 110° C., 1 min at 150° C.) so as to remove the unreacted photochemical radical initiator. The layer 3 is now insensitive to the deep UV light used in the irradiation and substantially planar, the thickness of the irradiated areas being 0.25 $\mu$m, and of the non-irradiated areas 0.22 $\mu$m. The sheet resistance of the area 31 is $4 \times 10^{13}$ $\Omega$/square (conductivity $10^{-9}$ S/cm), of the areas 32 and 33 it is 760 $\Omega$/square (conductivity 60 S/cm).

Immediately after having been filtered (Millex SR 0.5 $\mu$m), 3 ml precursor polythienylenevinylene solution prepared under B is spin-coated (3 s/500 rpm, 7 s/1000 rpm) on the layer 3. This precursor layer is then heated on a hot plate at 150° C. for 10 min in a nitrogen atmosphere containing HCl gas at a partial pressure of $2.3 \times 10^{-3}$ bar, thus converting the precursor layer into a 50 nm thick semiconducting layer 4 comprising a polythienylenevinylene.

Subsequently, 3 ml of a cross-linkable composition, consisting of 4.0 g (0.034 mol) polyvinylphenol (Polysciences Inc., cat #6527) and 0.65 g (1.66 mmol) hexamethoxymethylenemelamine (Cymel 300 from Cyanamid) dissolved in 36 g propylene glycol methyl ether acetate (Aldrich), is spin-coated (3 s/500 rpm, 27 s/2500 rpm) on the layer 4 and dried at 110° C. for 1 min on a hotplate. Cross-linking at 125° C. in a nitrogen atmosphere containing 5% v/v HCl for 5 min affords a 0.27 $\mu$m cross-linked polyvinylphenol electrically insulating layer 5. The dielectric constant of the cross-linked polyvinylphenol is 4.78 and its conductivity (at 1 kHz) $4.4 \times 10^{-11}$ S/cm.

Following the same procedure as used for applying the first electrode layer 3, except that a different mask is used, a second electrode layer 6 is applied on the layer 5. The second electrode layer 6 demonstrates a patchwork pattern of irradiated electrically insulating areas 61 and non-irradiated electrically conducting areas 62 (only one area shown), the latter areas accommodating the gate electrodes.

The manufacture of the field-effect transistor 1 substantially consisting of organic materials is now complete.

In order to (mechanically) protect the FET 1 from the environment, the FET 1 is covered by a 0.5 $\mu$m encapsulation layer obtained by spin-coating (3 s/500 rpm, 7 s/2000 rpm) a filtered (Millex LS 5 $\mu$m) solution of 1.5 g (0.028 mol) polyacrylonitrile (Polysciences Inc., cat# 3914) in 38.5 g N-methylpyrrolidone and drying at 110° C. for 1 min. Alternatively, a solution of 25 g polyvinylidenefluoride (Polysciences Inc, cat #15190) in 25 g N-methylpyrrolidone may be used.

Exemplary Embodiment 2

Figure 3:
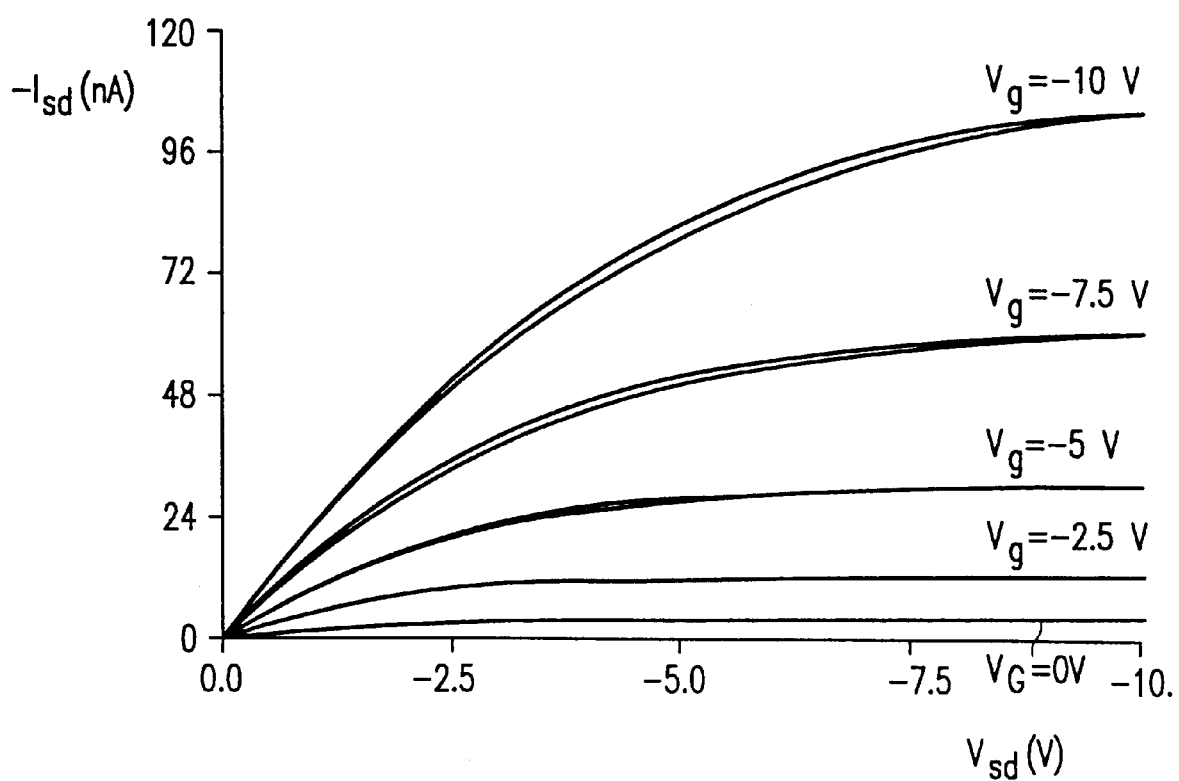
FIG. 3 shows a graph of the relationship between the source drain voltage $V_{sd}$ (in V) and the source drain current $I_{sd}$ (in nA) at specified gate voltages $V_g$ (in V) of a field-effect transistor manufactured using the method in accordance with the invention when subjected to a source drain voltage sweep from 0 to −10 V and back.

FIG. 3 shows a graph of the relationship between the source drain voltage $V_{sd}$ (in V) and the source drain current $I_{sd}$ (in nA) at specified gate voltages $V_g$ (in V) of a field-effect transistor 1, manufactured using the method of exemplary embodiment 1, when subjected to a source drain voltage sweep from 0 to −10 V and back. In this embodiment, the channel length L equals 2 μm and the channel width W equals 1 mm. At a source drain voltage difference of approximately 2.5 V, the channel transconductance exceeds the channel conductance, thus satisfying the condition for voltage amplification. The voltage sweep shows a substantially negligible hysteresis. The ratio of the current $I_{sd}(V_{sd}=-10\ V, V_g=-10\ V)$ and $I_{sd}(V_{sd}=-10\ V, V_g=0\ V)$, in short the on/off ratio, is 25. The FET mobility is $10^{-4}$ cm$^2$/Vs.

Similar results are obtained with FETs having a channel length of 3, 5 or 10 μm.

Exemplary Embodiment 3
(not according to the invention)

The method of exemplary embodiment 1 is repeated, with this difference that the patchwork patterned first electrode layer 3 is replaced by an electrode layer demonstrating a relief pattern. The relief pattern consists of 0.25 μm thick gold areas obtained by means of vacuum deposition using a shadow mask. The gold areas which accommodate the source and drain electrode are located such that the channel width is 10 mm and the channel length is 10 μm.

By performing similar voltage sweeps as shown in FIG. 3, it is found that the condition for voltage amplification is satisfied at source drain voltage differences below 10 V.

This embodiment demonstrates that the first electrode layer may be replaced by a metal electrode layer having a relief pattern and that a FET may satisfy the condition for voltage amplification below 10 V if a relief pattern is used which has a topography (in casu 0.25 μm) less than the thickness of the insulating layer (in casu 0.27 μm).

What is claimed is:

1. A method of manufacturing a field-effect transistor substantially consisting of organic materials on a substrate surface, said method comprising the steps of:
   providing an electrically insulating substrate surface,
   applying an organic first electrode layer accommodating a source and drain electrode and demonstrating a patchwork pattern of electrically insulating and conducting areas,
   applying an organic semiconducting layer,
   applying an organic electrically insulating layer having a thickness less than 0.3 μm,
   applying an organic second electrode layer accommodating a gate electrode.

2. A method as claimed in claim 1, wherein the organic first electrode layer is applied by performing the steps of
   applying an organic radiation-sensitive layer,
   irradiating said radiation-sensitive layer according to a desired pattern, thereby forming an organic first electrode layer accommodating a source and drain electrode and demonstrating a patchwork pattern of irradiated electrically insulating and non-irradiated conducting areas.

3. A method as claimed in claim 2, wherein a radiation-sensitive layer is applied which comprises an electrically conducting polyaniline and a photochemical radical initiator.

4. A method as claimed in claim 1, wherein the organic electrically insulating layer comprises a cross-linked polymer.

5. A method as claimed in claim 1, comprising the steps of:
   providing an electrically insulating substrate surface,
   applying, from solution, a first organic radiation-sensitive layer comprising a conductive polyaniline and a photochemical radical initiator,
   irradiating said first radiation-sensitive layer according to a desired pattern, thereby forming an organic first electrode layer accommodating a source and drain electrode and demonstrating a patchwork pattern of irradiated electrically insulating and non-irradiated conducting areas,
   heating the first electrode layer at a temperature sufficient to render said first electrode layer radiation-insensitive,
   applying, from solution, a second organic semiconducting layer comprising a polythienylenevinylene,
   applying, from solution, a cross-linkable polymer composition,
   cross-linking the cross-linkable polymer composition, thereby forming an organic electrically insulating layer comprising a cross-linked polymer composition,
   applying, from solution, a second organic radiation-sensitive layer comprising a conductive polyaniline and a photochemical radical initiator,
   irradiating said second radiation-sensitive layer according to a desired pattern, thereby forming an organic second electrode layer accommodating a gate electrode and demonstrating a patchwork pattern of irradiated electrically insulating and non-irradiated conducting areas.

6. A method as claimed in claim 1, wherein before the semiconducting layer is applied, the electrically insulating areas of the first electrode layer are removed, thereby forming a first electrode layer demonstrating a relief pattern of conducting areas.

7. A method of manufacturing a field-effect transistor substantially consisting of organic materials on a substrate surface, said method comprising the steps of:
   providing an electrically insulating substrate surface,
   applying an organic first electrode layer accomodating a source and drain electrode and demonstrating a patchwork pattern of electrically insulating and conducting areas,
   applying an organic semiconducting layer,
   applying an organic electrically insulating insulating layer of a thickness effective to satisfy the condition for voltage amplification at source drain voltages of less than 10V,
   applying an organic second electrode layer accomodating a gate electrode.

8. A method as claimed in claim 7, wherein the organic first electrode layer is applied by performing the steps of
   applying an organic radiation-sensitive layer,
   irradiating said radiation-sensitive layer according to a desired pattern, thereby forming an organic first electrode layer accomodating a source and drain electrode and demonstrating a patchwork pattern of irradiated electrically insulating and non-irradiated conducting areas.

9. A method as claimed in claim 8, wherein a radiation-sensitive layer is applied which comprises an electrically conducting polyanilene and a photochemical radical initiator.

10. A method as claimed in claim 7, wherein the organic electrically insulating layer comprises a cross-linked polymer.

11. A method as claimed in claim 7, comprising the steps of:
   providing an electrically insulating substrate surface,
   applying a first organic radiation-sensitive layer comprising a conductive polyaniline and a photochemical radiation initiator,
   irradiating said first radiation-sensitive layer according to a desired pattern, thereby forming an organic first electrode layer accomodating a source and drain electrode and demonstrating a patchwork pattern of irradiated electrically insulating and non-irradiated conducting areas,
   heating the first electrode layer at a temperature sufficient to render said first electrode layer radiation-insensitive,
   applying a second organic semiconducting layer comprising a polythienylenevinylene,
   applying a cross-linkable polymer composition,
   cross-linking the cross-linkable polymer composition, thereby forming an organic electrically insulating layer comprising a cross-linked polymer composition,
   applying a second organic radiation-sensitive layer comprising a conductive polyaniline and a photochemical radical initiator,
   irradiating said second radiation-sensitive layer according to a desired pattern, thereby forming an organic second electrode layer accomodating a gate electrode and demonstrating a patchwork pattern of irradiated electrically insulating and non-irradiated conducting areas.

12. A method as claimed in claim 7, wherein before the semiconducting layer is applied, the electrically insulating areas of the first electrode layer are removed, thereby forming a first electrode layer demonstrating a relief pattern of conducting areas.

13. A method of manufacturing a field-effect transistor, said method comprising the steps of:
   providing an electrically insulating substrate surface,
   applying a metal first electrode layer accomodating a source and drain electrode and demonstrating a relief pattern of electrically conducting areas,
   applying an organic semiconducting layer,
   applying an organic electrically insulating layer having a thickness effective to satisfy the condition for voltage amplification at source drain voltages of 10V or less,
   applying an organic second electrode layer accomodating a gate electrode.

14. A method as claimed in claim 13, wherein the thickness of the organic electrically insulating layer is less than 0.3 μm.

15. method as claimed in claim 14, wherein the organic second electrode layer is applied by performing the step of
   applying an organic radiation-sensitive layer,
   irradiating said radiation-sensitive layer according to a desired pattern, thereby forming the organic second electrode layer providing the gate electrode.

16. A method as claimed in claim 14, wherein the radiation-sensitive layer is applied by depositing a layer comprising an electrically conducting polyaniline and a photochemical radical initiator.

17. A method as claimed in claim 14, wherein the organic electrically insulating layer comprises a cross-linked polymer.

18. A method as claimed in claim 14, comprising the steps of:
   providing the electrically insulating substrate surface,
   applying the metal first electrode layer vacuum deposition of gold, said first electrode layer providing the source and the drain electrode and demonstrating the relief pattern of electrically conducting areas,
   applying the organic semiconducting layer by depositing a layer comprising a polytheinylenevinylene,
   applying a cross-linkable polymer composition comprising a polyvinylphenol,
   cross-linking the cross-linkable polymer compostion, thereby forming the organic electrically insulating layer comprising a cross-linked polymer,
   applying an organic radiation-sensitive layer by depositing a layer comprising an electrically conducting polyaniline and a photochemical radical initiator,
   irradiating said radiation-sensitive layer according to a desired pattern, thereby forming the organic second electrode layer providing the gate.

19. A method as claimed in claim 14, wherein gold is used as the metal first electrode layer.

20. A method of manufacturing a field-effect transistor substantially consisting of organic materials on a substrate surface, said method comprising the steps of:
   providing an electrically insulating substrate surface,
   applying an organic first electrode layer accomodating a gate electrode and demonstrating a patchwork pattern of electrically insulating and conducting areas,
   applying an organic insulating layer of a thickness effective to satisfy the condition for voltage amplification at source drain voltages of less than 10V,
   applying an organic semiconducting layer,
   applying an organic second electrode layer accomodating a source and a drain electrode.

21. A method of manufacturing a field-effect transistor substantially consisting of organic material on a substrate surface, said method comprising the steps of:
   providing an electrically insulating substrate surface,
   providing a first organic electrode layer accomodating a gate electrode and demonstrating a patchwork pattern of electrically insulating and conductive areas,
   applying an organic insulating layer of a thickness effective to satisfy the condition for voltage amplification at source drain voltages of less than 10V,
   applying an organic second electrode layer accomodating a source and a drain electrode,
   applying an organic semiconducting layer.

22. A method of manufacturing a field-effect transistor, said method comprising the steps of:
   providing an electrically insulating substrate surface,
   applying a metal first electrode layer accomodating a gate electrode and demonstrating a relief pattern of electrically conducting areas,
   applying an organic electrically insulating layer having a thickness effective to satisfy the condition for voltage amplification at source drain voltages of 10 V or less,
   applying an organic semiconducting layer,
   applying an organic second electrode layer accomodating a source and a drain electrode.

23. A method of manufacturing a field-effect transistor, said method comprising the steps of:
   providing an electrically insulating substrate surface, applying a metal first electrode layer accomodating a gate electrode and demonstrating a relief pattern of electrically conducting areas, applying an organic electrically insulating layer of a thickness effective to satisfy the condition for voltage amplification at source drain voltages of less than 10V, applying an organic second electrode layer, accomodating a source and a drain electrode, applying an organic semiconducting layer.

24. A method of manufacturing a field effect transistor substantially consisting of organic material on a substrate surface, said method comprising the steps of:

providing an electrically insulating substrate surface, applying a first electrode organic layer accomodating a gate electrode, applying an organic electrically insulating layer having a thickness less than 0.3 $\mu$m, applying an organic semiconductor layer, applying a second electrode organic layer accomodating a source and a drain electrode and demonstrating a patchwork pattern of electrically insulating and conducting layers.

25. A method of manufacturing a field effect transistor substantially consisting of organic materials on a substrate surface, said method comprising the steps of:

providing an electrically insulating substrate surface, applying a first electrode organic layer accomodating a gate electrode, applying an organic electrically insulating layer having a thickness less than 0.3 $\mu$m, applying a second electrode organic layer accomodating a source and a drain electrode and demonstrating a patchwork pattern of electrically insulating and conducting layers, applying an organic semiconducting layer.

* * * * *